US011761518B2

United States Patent
Rhee

(10) Patent No.: US 11,761,518 B2
(45) Date of Patent: Sep. 19, 2023

(54) LINEAR MOTION ROTARY UNION

(71) Applicant: SEALINK CORP., Seoul (KR)

(72) Inventor: Hee Jang Rhee, Gunpo-si (KR)

(73) Assignee: SEALINK CORP., Seoul (KR)

(*) Notice: Subject to any disclaimer, the term of this patent is extended or adjusted under 35 U.S.C. 154(b) by 693 days.

(21) Appl. No.: 16/940,908

(22) Filed: Jul. 28, 2020

(65) Prior Publication Data

US 2020/0355247 A1    Nov. 12, 2020

Related U.S. Application Data

(63) Continuation of application No. PCT/KR2018/014587, filed on Nov. 26, 2018.

(30) Foreign Application Priority Data

Feb. 13, 2018    (KR) .......................... 10-2018-0018002

(51) Int. Cl.
    *F16H 25/12*    (2006.01)
    *C23C 16/455*    (2006.01)
    (Continued)

(52) U.S. Cl.
    CPC ......... *F16H 25/12* (2013.01); *C23C 16/4584* (2013.01); *C23C 16/45544* (2013.01); *F16L 27/125* (2013.01)

(58) Field of Classification Search
    CPC .... F16H 25/12; C23C 16/4584; F16L 27/125; F16L 39/04
    (Continued)

(56) References Cited

U.S. PATENT DOCUMENTS 2,218,473 A * 10/1940 Minor ..................... E21B 21/02
                                                            285/281
3,292,937 A * 12/1966 Nunley ................. B04B 5/0442
                                                            277/369
(Continued)

FOREIGN PATENT DOCUMENTS

JP    2004137997 A    5/2004
JP    2017080830 A    5/2017
(Continued)

OTHER PUBLICATIONS

International Search Report of PCT/KR2018/014587 dated Feb. 26, 2019.

*Primary Examiner* — David Bochna
(74) *Attorney, Agent, or Firm* — Dinsmore & Shohl LLP; Yongsok Choi, Esq.

(57) ABSTRACT

Provided is a linear movable rotary union including a driving shaft comprising a plurality of fluid supply paths; a hollow middle housing surrounding an outside of the driving shaft and comprising a plurality of first through holes in a sidewall; a plurality of first sealing members provided between the middle housing and the driving shaft to prevent leakage of a fluid; a hollow outer housing surrounding an outside of the middle housing and comprising a plurality of second through holes in a sidewall; and a plurality of second sealing members provided between the middle housing and the outer housing to prevent leakage of the fluid, and wherein the driving shaft is installed to be capable of rotational motion in the middle housing, and the middle housing is installed to be capable of reciprocating motion in an axial direction in the outer housing.

15 Claims, 6 Drawing Sheets

(51) Int. Cl.
*C23C 16/458* (2006.01)
*F16L 27/12* (2006.01)

(58) Field of Classification Search
USPC ...... 285/273, 280, 281, 121.1, 121.2, 121.3, 285/121.6
See application file for complete search history.

(56) References Cited

U.S. PATENT DOCUMENTS

| | | |
|---|---|---|
| 5,799,692 A | 9/1998 | Gobell et al. |
| 6,485,062 B2 * | 11/2002 | Omiya .................... F16L 39/04 285/121.6 |
| 7,976,069 B2 * | 7/2011 | Imai ........................ F16L 39/06 285/190 |
| 2005/0046181 A1 * | 3/2005 | Falconer ................. F16L 39/06 285/121.6 |

FOREIGN PATENT DOCUMENTS

| | | |
|---|---|---|
| KR | 100418278 B1 | 2/2004 |
| KR | 1020050069735 A | 7/2005 |
| KR | 100999445 B1 | 12/2010 |
| KR | 101556356 B1 | 10/2015 |
| WO | 2009109355 A1 | 9/2009 |

\* cited by examiner

LINEAR MOTION ROTARY UNION

CROSS-REFERENCE TO RELATED APPLICATIONS

This application is a continuation of International Application No. PCT/KR2018/014587 filed on Nov. 26, 2018 which claims priority to Korean Patent Application No. 10-2018-0018002 filed on Feb. 13, 2018, the entire contents of which are herein incorporated by reference.

TECHNICAL FIELD

The present disclosure relates to a linear movable rotary union. More specifically, the present disclosure relates to a rotary union enabling linear motion of a rotating driving shaft in the axial direction, while effectively preventing leakage of various kinds of fluids flowing through the driving shaft and an outer housing in the pressure and vacuum state.

BACKGROUND ART

Semiconductor equipments are used for mass production of commercially important integrated circuits. Physical vapor deposition (PVD) such as sputtering and chemical vapor deposition (CVD) using chemical reaction are used to deposit thin films of a predetermined thickness on a substrate such as a semiconductor wafer or glass. CVD include atmospheric pressure chemical vapor deposition (APCVD), low pressure chemical vapor deposition (LPCVD), and plasma organic chemical vapor deposition (Plasma Enhanced CVD).

With the high integration of semiconductor devices, thin films with fine patterns are required. Accordingly, the use of an atomic layer deposition (ALD) that is capable of very uniformly forming a fine pattern of an atomic layer thickness and having excellent step coverage is being expanded. For example, ALD is used for the deposition of thin films such as gate oxide films, capacitor dielectric films, and diffusion barriers in a semiconductor manufacturing process.

In an apparatus for atomic layer deposition, a plurality of integrated circuits are layered on a silicon equipment circuit board, where a polishing process needs to be performed by a chemical-mechanical polishing application (hereinafter referred to as CMP).

The CMP is performed by contacting and rotating a polishing pad supplied with chemicals including deionized water, a corrosive solution, and a polishing slurry on an active surface of a silicon equipment circuit substrate and removing impurities of the surface by a chemical or mechanical reaction process and flattening the surface.

In the CMP, a rotary union is installed to transfer fluid flowing from a fixing portion to a rotating portion.

That is, the rotary union is a rotating pipe joining apparatus used when supplying or discharging a fluid with pressure or a vacuum under atmospheric pressure from a fixing pipe to a rotating portion of various machinery without leaking the fluid, which may be used, for example, when supplying a heating medium such as steam, hot water, and hot oil for heating and a cooling medium such as water, ammonia, and freon for cooling to a rotating drum, cylinder, etc. or an operating medium such as compressed air or hydraulic oil to a rotating device such as clutch and brake operating by fluid.

SUMMARY

Technical Problem

Provided is a linear movable rotary union enabling reciprocation of a middle housing in the vertical direction, that is, in the axial direction, with respect to an outer housing, while rotating a driving shaft with a fluid supply path with respect to the middle housing.

Provided is also a linear movable rotary union simultaneously enabling rotational motion and reciprocating motion in the axial direction, while improving the sealing force between a driving shaft and a middle housing and between the middle housing and an outer housing and preventing leakage of a fluid in the pressure and vacuum state.

Provided is also a linear movable rotary union capable of simplifying a sealing structure to facilitate manufacture, maintenance, and repair, minimizing the size to reduce an installation space, and allowing a driving shaft and a middle housing to linearly contact each other to minimize friction and require no supply of lubricant.

Solution to Problem

According to an aspect of the present disclosure, a linear movable rotary union includes a driving shaft comprising a plurality of fluid supply paths; a hollow middle housing surrounding an outside of the driving shaft and comprising a plurality of first through holes in a sidewall; a plurality of first sealing members provided between the middle housing and the driving shaft to prevent leakage of a fluid; a hollow outer housing surrounding an outside of the middle housing and comprising a plurality of second through holes in a sidewall; and a plurality of second sealing members provided between the middle housing and the outer housing to prevent leakage of the fluid, and wherein the driving shaft is installed to be capable of rotational motion in the middle housing, and the middle housing is installed to be capable of reciprocating motion in an axial direction in the outer housing.

A bearing may be provided between the driving shaft and the middle housing, and the first sealing member is a seal for rotational motion.

The middle housing may be formed in a multistep with an outer diameter decreasing toward one end portion, and the outer housing is formed in a multistep with an inner diameter decreasing toward one end portion, and a locking protrusion may be formed on each of a part of the middle housing where the outer diameter decreases and a part of the outer housing where the inner diameter decreases to restrict reciprocating motion in the axial direction of the middle housing.

A projection extending along the axial direction may be formed on any one of an outer circumferential surface of the middle housing and an inner circumferential surface of the outer housing, and a groove into which the projection is inserted may be formed in the other one.

The second sealing member may be a linear seal for reciprocating motion.

The first sealing member and the second sealing member may be formed of synthetic resin.

An outer circumferential surface of the driving shaft, an inner circumferential surface and an outer circumferential surface of the middle housing, and an inner circumferential surface of the outer housing may be polished.

The linear movable rotary union may further include a driving unit connected to one end portion of the driving shaft to allow the driving shaft to be capable of rotational motion with respect to the middle housing and connected to one end portion of the middle housing to allow the middle housing to be capable of reciprocating motion in the axial direction with respect to the outer housing.

The driving unit may include a linear guide connected to the middle housing.

The plurality of first sealing members may be provided on an inner circumferential surface of the middle housing and are spaced apart from each other to respectively correspond to positions of the plurality of fluid supply paths of the driving shaft.

The plurality of second sealing members may be provided on an outer circumferential surface of the middle housing, connected to only the second through holes of the outer housing respectively corresponding to the first through holes of the middle housing and spaced apart from each other in positions of the other second through holes where sealing is maintained.

The first sealing member may be a lip seal with a curved lip formed on an inner periphery of an annular sealing.

A fluid introduced from the fluid supply path may be discharged to the second through hole at a moment when the fluid supply path of the driving shaft, the first through hole of the middle housing, and the second through hole of the outer housing are connected with each other.

A fluid introduced from the second through hole may be discharged to the fluid supply path at a moment when the fluid supply path of the driving shaft, the first through hole of the middle housing, and the second through hole of the outer housing are connected with each other.

A negative pressure chamber may be connected to any one of the plurality of second through holes, and negative pressure may be formed in any one of the plurality of fluid supply paths connected with the negative pressure chamber.

According to an aspect of the present disclosure, a linear movable rotary union includes a driving shaft comprising a plurality of fluid supply paths; a hollow middle housing surrounding an outside of the driving shaft and comprising a plurality of first through holes in a sidewall; a plurality of first sealing members provided between the middle housing and the driving shaft to prevent leakage of a fluid; a hollow outer housing surrounding an outside of the middle housing and comprising a plurality of second through holes in a sidewall; and a plurality of second sealing members provided between the middle housing and the outer housing to prevent leakage of the fluid, and wherein the driving shaft is installed to be capable of vertical motion in an axial direction in the middle housing, and the middle housing is installed to be capable of rotational motion in the outer housing.

Advantageous Effects of Disclosure

The linear movable rotary union according to the present disclosure may enable a driving shaft to rotate and simultaneously transfer in the vertical direction with respect to an outer housing together with a middle housing, and thus the rotary union may adjust a distance in the vertical direction with respect to a work object without a separate apparatus.

In addition, the linear movable rotary union includes a sealing member between the driving shaft, the middle housing and the outer housing, thereby effectively preventing leakage of a fluid even during rotational motion and reciprocating motion in the axial direction.

In addition, the linear movable rotary union may improve the sealing force to prevent leakage of the fluid, simplify a sealing structure to facilitate manufacturing, maintenance and repair, and minimize the size to reduce an installation space.

In addition, the linear movable rotary union may linearly contact the sealing member with a rotating object to minimize the frictional force, which requires no separate supply of a lubricant, and thus the structure may be very brief and simple.

DETAILED DESCRIPTION

Figure 1:
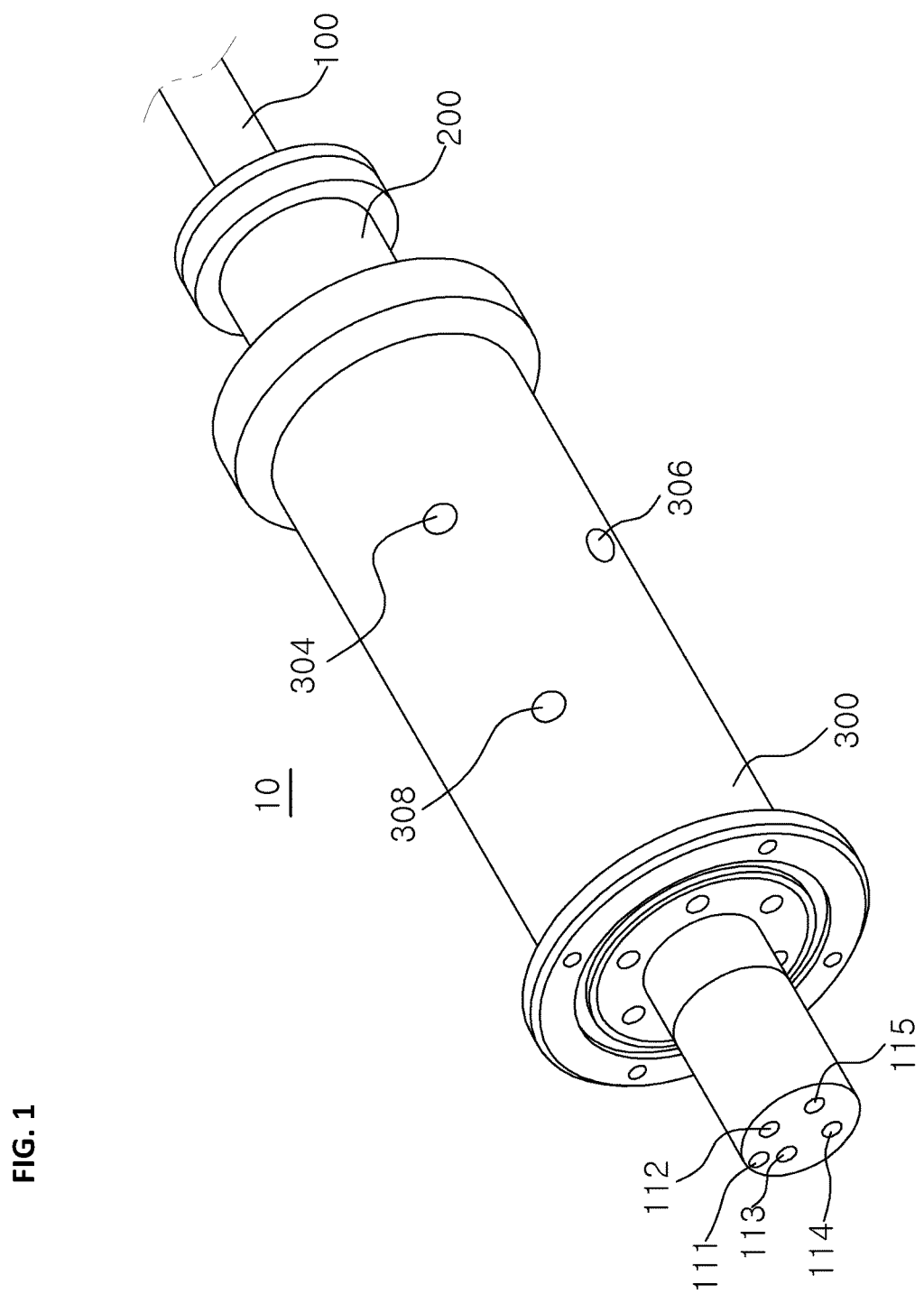
FIG. 1 is a perspective view of a linear movable rotary union according to an embodiment of the present disclosure.

The disclosure will now be described more fully with reference to the accompanying drawings, in which embodiments of the disclosure are shown. The disclosure may, however, be embodied in many different forms and should not be construed as being limited to the embodiments set forth herein; rather, these embodiments are provided so that this disclosure will be thorough and complete, and will fully convey the concept of the disclosure to those of skill in the art. For clarity, portions that are not relevant to the description of the disclosure are omitted.

The terms used in the present specification are merely used to describe particular embodiments of the disclosure, and are not intended to limit the disclosure. An expression used in the singular encompasses the expression of the plural, unless it has a clearly different meaning in the context.

In the present specification, it is to be understood that the terms such as "including", "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

In addition, the components shown in the embodiments of the present disclosure are shown independently to represent different characteristic functions, and do not mean that each component may include separate hardware or one software unit. That is, each component is described by listing each component for convenience of description, and at least two of the components may be combined to form one component, or one component may be divided into a plurality of components to perform a function. The integrated and separated embodiments of each of these components are also included within the scope of the present disclosure without departing from the spirit of the disclosure.

In addition, embodiments below are provided so that this disclosure will be thorough and complete, and will fully convey the concept of the disclosure to those skilled in the art. In the drawings, sizes and thicknesses of components may be exaggerated for clarity.

Hereinafter, the disclosure will be described in detail with reference to the attached drawings.

Figure 2:
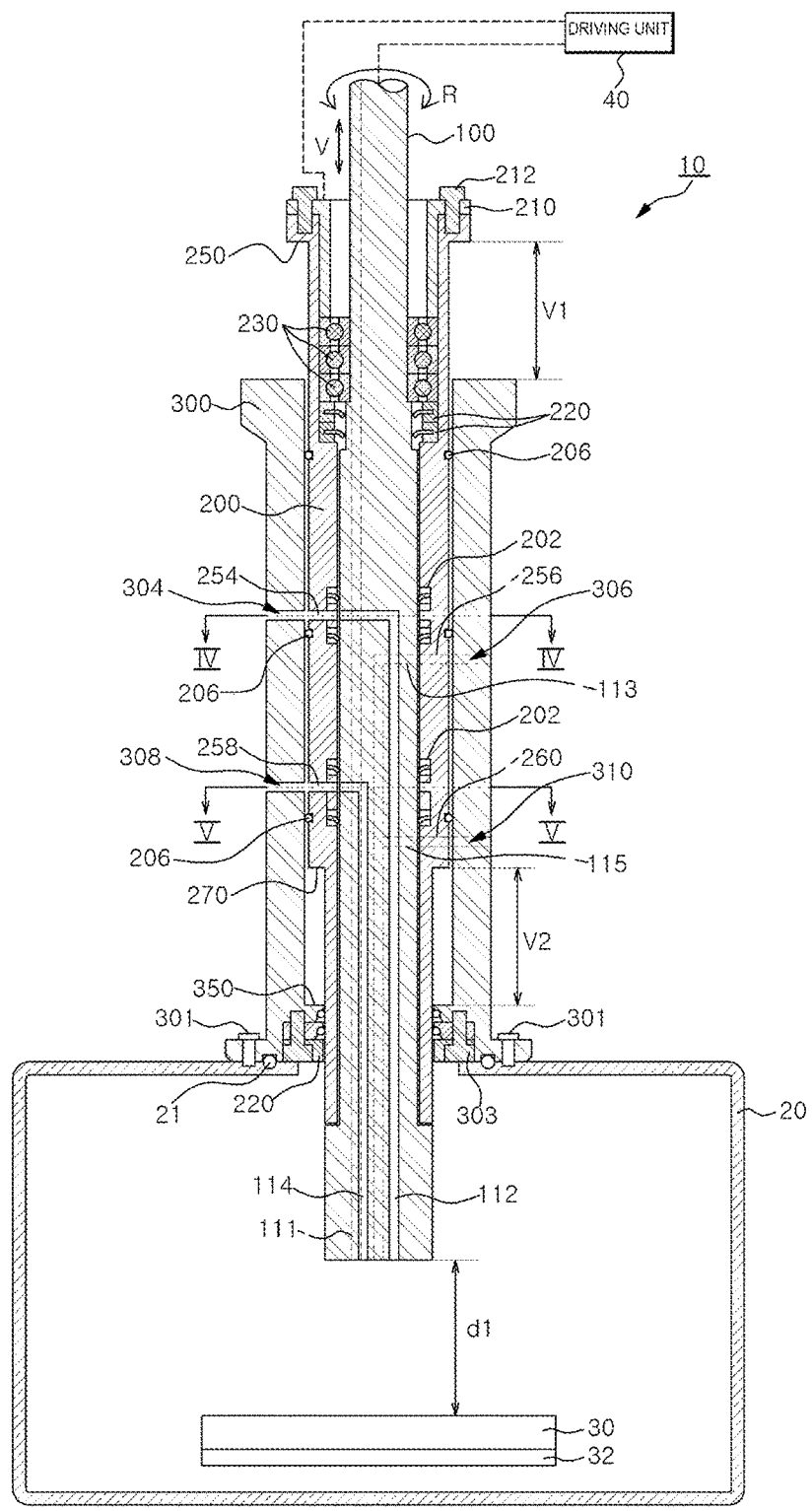
FIG. 2 is a cross-sectional view of a linear movable rotary union in a first position according to an embodiment of the present disclosure.
Figure 3:
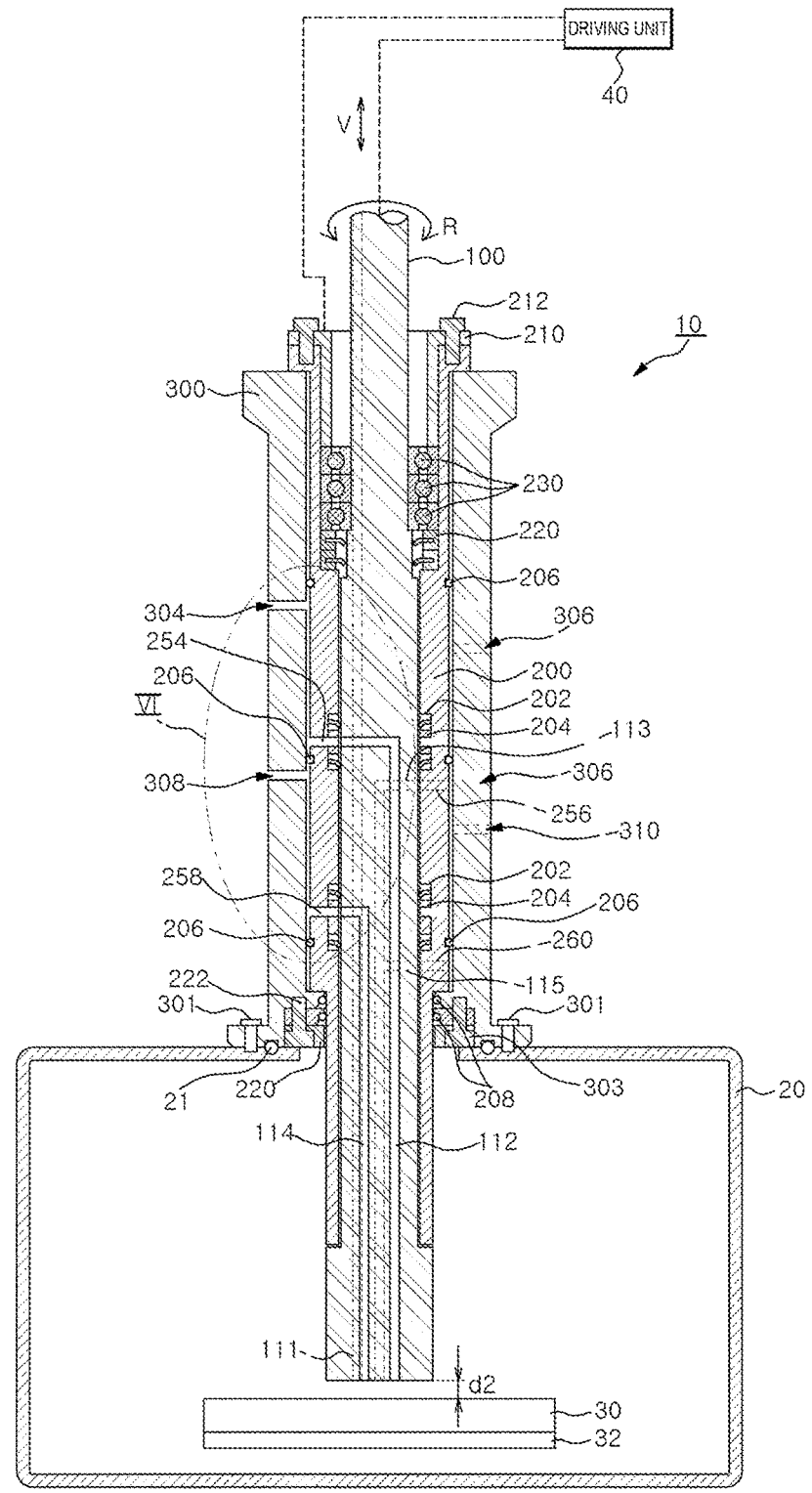
FIG. 3 is a cross-sectional view of the linear movable rotary union at a second position according to an embodiment of the present disclosure.

FIG. 1 is a perspective view of a linear movable rotary union according to an embodiment of the present disclosure, and FIG. 2 is a cross-sectional view of a linear movable rotary union in a first position according to an embodiment of the present disclosure. FIG. 3 is a cross-sectional view of the linear movable rotary union at a second position according to an embodiment of the present disclosure.

Referring to FIGS. 1 to 3, a linear movable rotary union 10 according to an embodiment of the present disclosure may be semiconductor equipment, for example, a rotary union applied to a chemical vapor deposition (CVD) process or atomic layer deposition (ALD), an ion implantation process, an OLED and an etching process. The linear movable rotary union 10 according to an embodiment of the present disclosure may be used in an ALD apparatus, and may be provided to adjust a distance to process a semiconductor wafer 30 mounted on a susceptor 32 disposed in a process chamber 20 and supply a working fluid.

The linear movable rotary union 10 may include a driving shaft 100, a middle housing 200, a first sealing member 202, an outer housing 300, and a second sealing member 206.

The driving shaft 100 is formed in which a plurality of fluid supply paths 112, 113, 114, and 115 have different lengths along the axis. In the present embodiment, the four fluid supply paths 112, 113, 114, and 115 are provided and formed parallel to each other, but are not limited thereto. One fluid supply path may be disposed at the center of the shaft and multiple fluid supply paths having different lengths may be arranged at an equal interval on the outside with respect to the one fluid supply path. In the fluid supply paths 112, 113, 114, and 115, a coolant for suppression of a temperature rise may flow, and various working fluids for surface treatment may flow. In addition, the fluid supply paths 112, 113, 114, and 115 may be connected with an external pressurization or negative pressure chamber to form pressurization or negative pressure in the fluid supply paths 112, 113, 114, and 115. In each of the fluid supply paths 112, 113, 114, and 115, multiple fluid supply holes connected with the end of a part extending in the axial direction may be formed on the outer periphery.

In addition, a temperature sensor element (not shown) for measuring temperature may be provided at one end of the driving shaft 100, and a sensor through hole 111 into which a wire or a connector electrically connected to the temperature sensor element may penetrate may be provided inside the driving shaft 100. A value of the temperature measured by the temperature sensor element through the sensor through hole 111 may be transferred to a separate measuring apparatus (not shown) through a connector passing through the sensor through hole 111. Another sensor such as a heating wire or a pressure sensor may be connected through the sensor through hole 111. It is preferable that the sensor through hole 111 is provided in a position where the sensor through hole 111 and the fluid supply paths 112, 113, 114, and 115 are not connected with each other in consideration of the positions of the fluid supply paths 112, 113, 114, and 115.

The middle housing 200 is a cylindrical body having a hollow of a predetermined size such that the driving shaft 100 may be inserted, and a plurality of first through holes 254, 256, 258, and 260 vertically connected with the hollow may be formed on the sidewall. The first through holes 254 256, 258, and 260 may be spaced apart from each other along the axial direction in different positions and may be formed at an equal interval along the outer periphery of the middle housing 200. A plurality of bearings 230 and first sealing members 202 and 220 that circumscribe the middle housing 200 may be provided in the inner periphery of the middle housing 200. It is preferable that a plurality of radial bearings are provided as the bearing 230. In addition, a cover 210 for fixing the bearing 230 may be provided on one end of the middle housing 200, and may be fixed to the middle housing 200 by a fastening bolt 212 while being fitted inside the middle housing 200.

A plurality of first sealing members 202 and 220 may be provided between the middle housing 200 and the driving shaft 100 to prevent leakage of the fluid therebetween. Specifically, the driving shaft 100 is provided with the first sealing members 202 and 220 that are supported by the plurality of bearings 230 between the middle housings 200 to enable rotational motion R, and during rotational motion, are interposed in the inner peripheries of the middle housings 200 and grounded to the outer periphery of the driving shaft 100 to improve the sealing force. A plurality of first sealing members 202 and 220 are provided on the inner circumferential surface of the middle housing 200, and are spaced apart from each other so as to correspond to the positions of the fluid supply paths 112, 113, 114, and 115 of the driving shaft 100. In more detail, the plurality of first sealing members 202 may be respectively disposed on the positions corresponding to the positions of the plurality of fluid supply holes which are formed in the outer periphery of the driving shaft 100 so as to be connected with the fluid supply paths 112, 113, 114, and 115. Owing to the arrangement of the first sealing member 202, each of the first through holes 254, 256, 258, and 260 of the middle housing 200 may be selectively connected to any one of the corresponding fluid supply paths 112, 113, 114, and 115 of the driving shaft 100 and may not be connected with the other fluid supply path.

The first sealing members 202 and 220 may be seals for rotational motion, or may be lip seals formed of synthetic resin. The sizes of the first sealing members 202 and 220 may be different from each other depending on the outer diameter of the driving shaft 100 in the installation position.

The outer housing 300 is a cylindrical body having a hollow having a predetermined size such that the middle housing 200 may be inserted therein, and a plurality of second through holes 304, 306, 308, and 310 that are vertically connected with the hollow may be formed on the sidewall. A plurality of second sealing members 206 that circumscribe the outer housing 300 may be provided on the inner periphery of the outer housing 300.

A plurality of second sealing members 206 are provided between the outer housing 300 and the middle housing 200 to prevent leakage of fluid therebetween. Specifically, the middle housing 200 may be capable of reciprocating motion V in the vertical direction, i.e. in the axial direction, between the outer housings 300 and provided with the plurality of second sealing members 206 interposed in the inner peripheries of the outer housings 300 and grounded to the outer periphery of the middle housing 200 to improve the sealing force. The second sealing member 206 is a ring-shaped seal and may be formed of synthetic resin. The second sealing member 206 may be a linear seal for reciprocating motion. In the present embodiment, an O-ring is used as the second sealing member 206, but the present disclosure is not limited thereto, and various types of linear seals capable of reciprocating motion may be applied.

A plurality of second sealing members 206 may be provided on the outer circumferential surface of the middle housing 200, may be connected with any one of the second through holes 304, 306, 308, and 310 of the middle housing 200 respectively corresponding to the first through holes 254, 256, 258, and 260 of the middle housing 200 and may be spaced apart from each other so as to maintain sealing in the other second through holes.

The driving shaft 100 is installed to be capable of rotational motion R in the middle housing 200, and the middle housing 200 is installed to be capable of reciprocating motion V in the axial direction in the outer housing 300. In this case, the linear movable rotary union 10 is electrically/mechanically connected to an external driving unit 40 such that the driving shaft 100 may perform rotational motion, and the middle housing 200 and the driving shaft 100 may perform reciprocating motion V in the axial direction together with respect to the housing 300. As an example, the driving unit 40 may include a motor and a linear guide.

Meanwhile, referring to FIG. 2, the middle housing 200 may be formed in the multistep with an outer diameter decreasing toward one end portion, and the outer housing 300 may be formed in the multistep with an inner diameter decreasing toward one end portion. A locking protrusion is formed on each of a part 270 of the middle housing 200 where the outer diameter decreases and a part 350 of the outer housing 300 where the inner diameter decreases, i.e., a part protruding inward, to restrict reciprocating motion V in the axial direction the middle housing 200 by a predetermined distance.

In addition, the middle housing 200 may have a shape in which the outer diameter increases toward the other end portion. A part 250 where the outer diameter increases is provided in the other end portion of the middle housing 200, and during reciprocating motion V in the axial direction of the middle housing 200, when moving vertically downward in the drawing, may be locked on the other end portion of the outer housing 300 to restrict the movement in the axial direction of the middle housing 200 by a predetermined distance. As an example, in FIG. 2, a distance V1 and a distance V2 may be set to be the same.

Meanwhile, although not shown, a projection extending along the axial direction may be formed on any one of the outer circumferential surface of the middle housing 200 and the inner circumferential surface of the outer housing 300, and a groove into which the projection is inserted may be formed in the other one. Due to this, the middle housing 200 may be capable of only reciprocating motion in the axial direction in the outer housing 300, and may prevent rotation in the outer housing 300. In addition, a plurality of third sealing members 208 may be provided on one end portion of the outer housing 300. The third sealing member 208 is for sealing between the middle housing 200 and the outer housing 300, and a linear seal exhibiting excellent sealing performance for reciprocating motion is suitable so as to be applicable to the middle housing 200 performing reciprocating motion in the axial direction. In the present embodiment, an O-ring is used, but the present disclosure is not limited thereto, and various types of linear seals may be applied. Meanwhile, the cover 220 for fixing the third sealing member 208 is provided on one end of the outer housing 300, and a fastening bolt 303 penetrating the cover 220 is fastened to the outer housing 300 and to fix the cover 220.

As in the present embodiment, when the process chamber 20 is coupled to one end of the outer housing 300, the third sealing member 208 also serves to seal between the inside of the process chamber 20, the middle housing 200 and the outer housing 300. In addition, the outer housing 300 and the process chamber 20 may be fixed by the fastening bolt 301, in this case, a fourth sealing member 21 in the shape of an O-ring may be provided on one end of the outer housing 300 to seal the process chamber 20 from the outside.

In the present embodiment, although the middle housing 200 is inserted directly into the outer housing 300 by way of example, a cylindrical bush (not shown) may be provided on the inner circumferential surface of the outer housing 300. The bush is for reducing friction between the middle housing 200 and the outer housing 300, and various types of bushes may be used, but a slide bush provided with a solid lubricant may also be used.

The outer circumferential surface of the driving shaft 100, the inner circumferential surface and the outer circumferential surface of the middle housing 200, and the inner circumferential surface of the outer housing 300 may be polished to have a high hardness and a precise surface. This is to bring the contact stress distribution and the temperature distribution between contact surfaces into uniformity, and when polished, the airtightness between the driving shaft 100 and the middle housing 200 and between the middle housing 200 and the outer housing 300 may be further secured. As an example of polishing, a predetermined coating material is coated to a surface of at least one end portion of the driving shaft 100, the middle housing 200, and the outer housing 300 processed by using a method such as mechanical and heat treatment to a certain thickness and then, the coated surface is polished to have a uniform thickness. At this time, the reason for polishing after coating as described above is that the coating thickness may be arbitrarily adjusted and the uniform coating thickness may be obtained. However, the present disclosure is not necessarily limited thereto, and it is possible to perform a coating operation after polishing.

Hereinafter, the operation of the linear movable rotary union according to an embodiment of the present disclosure will be described.

Figure 4:
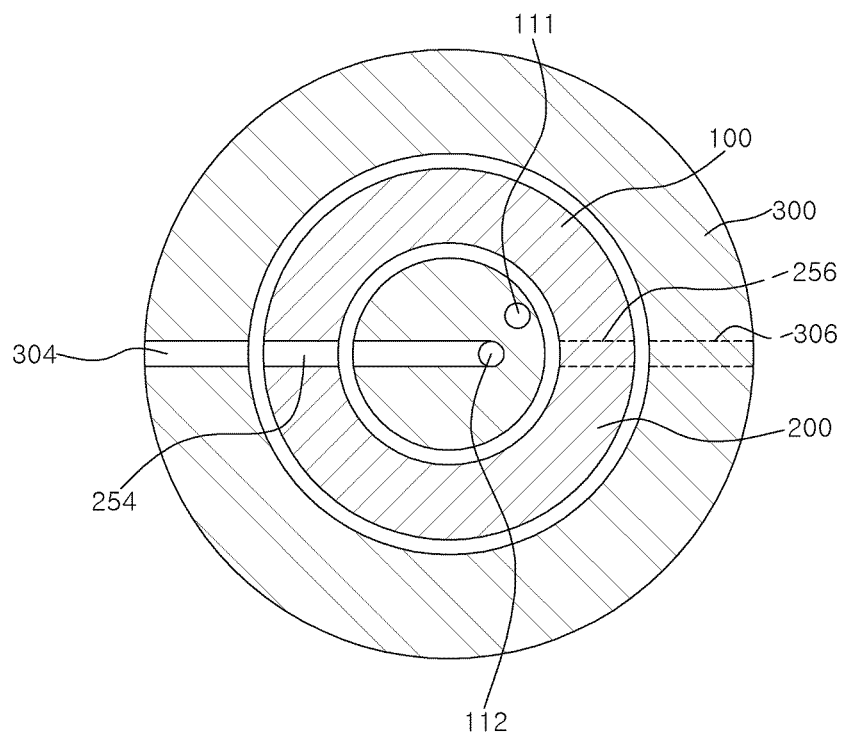
FIG. 4 is a cross-sectional view taken along a line IV in FIG. 2.
Figure 5:
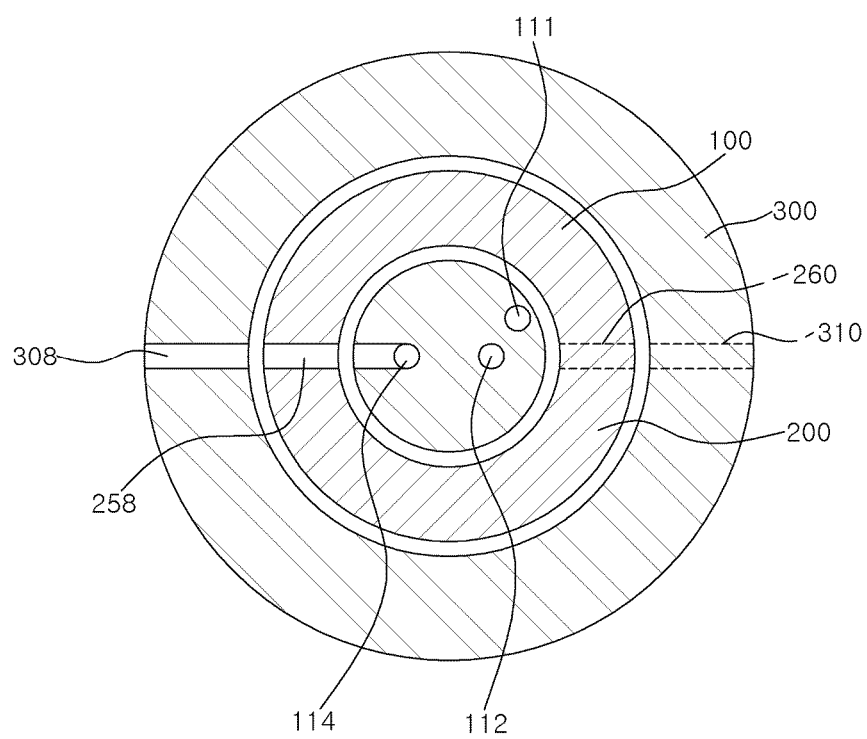
FIG. 5 is a cross-sectional view taken along a line V in FIG. 2.
Figure 6:
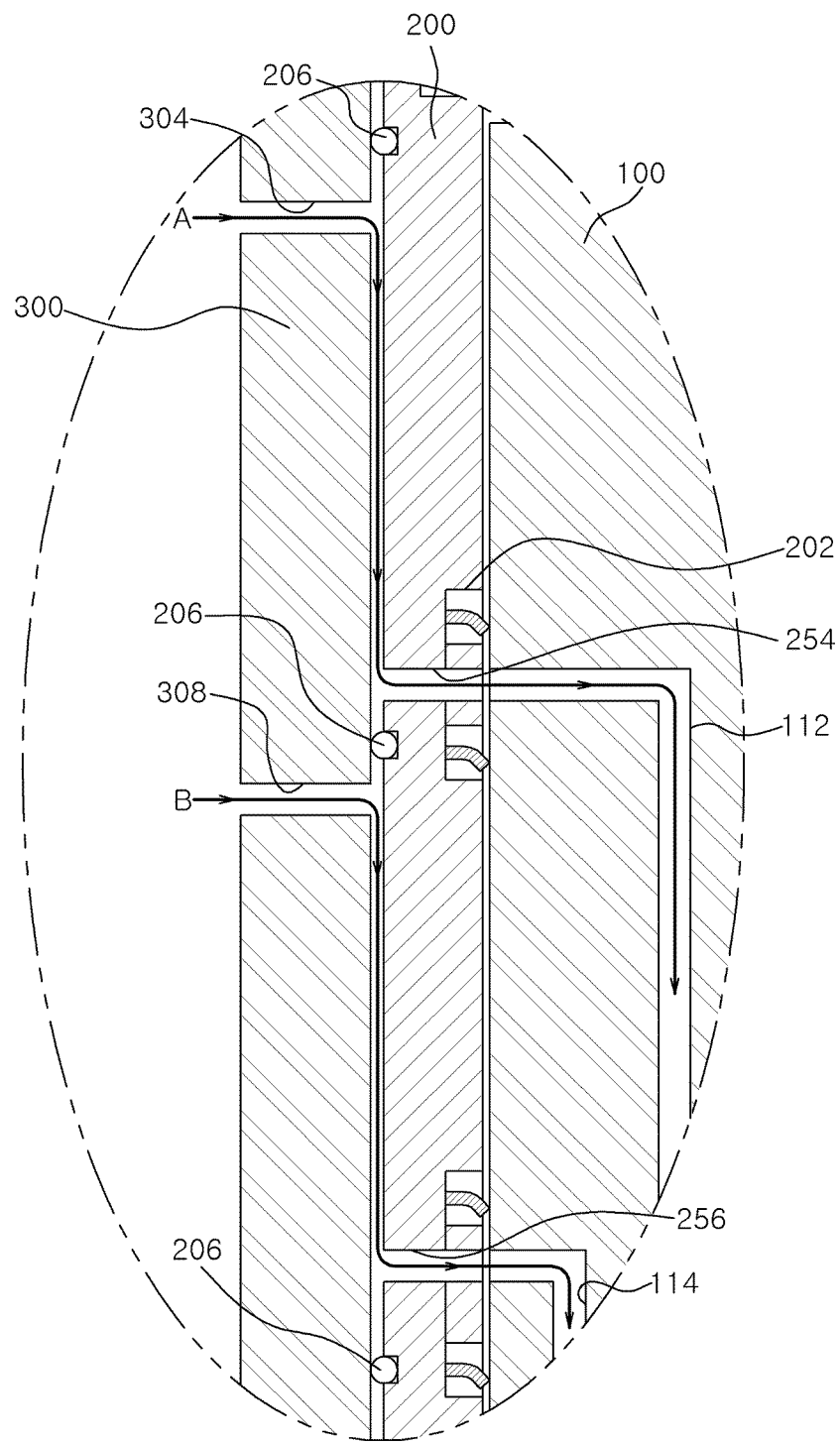
FIG. 6 is an enlarged conceptual view of a region VI in FIG. 3.

FIG. 4 is a cross-sectional view taken along a line IV in FIG. 2, and FIG. 5 is a cross-sectional view taken along a line V in FIG. 2. FIG. 6 is an enlarged conceptual view of a region VI in FIG. 3.

Referring to FIGS. 2 to 6, in the rotary union 10 according to an embodiment of the present disclosure, the driving shaft 100 including the plurality of fluid supply paths 112, 113, 114, and 115 therein may rotate at high speed in the middle housing 200. The plurality of first through holes 254, 256, 258, and 260 are provided on side walls of the middle housing 200, and the second through holes 304, 306, 308, and 310 respectively corresponding to the first through holes 254, 256, 258, and 260 are provided on side walls of the outer housing 300. According to the rotation of the driving shaft 100, there is a moment when each of the fluid supply paths 112, 113, 114, and 115 is connected with any one of the first through holes, and at this time, a fluid supplied to the second through hole at a certain pressure may eventually be transferred to the fluid supply path through the first through hole. Conversely, a pressurized fluid supply chamber may be connected to the fluid supply paths 112, 113, 114, and 115, and in this case, a fluid supplied at a certain pressure through the fluid supply paths 112, 113, 114, and 115 may be transferred to the outside through the first through hole and the second through hole at the moment when each fluid supply path is connected with the corresponding first through hole.

In the conditions as shown in FIGS. 2 and 4, since the fluid supply path 112 and the first through hole 254 and the second through hole 304 are connected, a fluid supplied at a predetermined pressure through the second through hole 304 may be transferred into the process chamber 20 through the fluid supply path 112. At the same time, as shown in FIG. 5, since the fluid supply path 114 and the first through hole 258 and the second through hole 308 are connected, a fluid supplied at a predetermined pressure through the second through hole 308 may be transferred into the process chamber 20 through the fluid supply path 114.

Meanwhile, when a negative pressure chamber is connected to any one of the second through holes 304, 306, 308, and 310, at the moment when any one of the fluid supply paths 112, 113, 114, and 115 of the driving shaft 100 is connected with the one of the second through holes to which the negative pressure chamber is connected according to the rotation of the driving shaft 100, negative pressure may be formed in the fluid supply path. In this case, negative pressure is formed at one end of the driving shaft 100 through the fluid supply paths 112, 113, 114, and 115, such that vacuum adsorption is possible, and thus it may be used to lift a semiconductor wafer or the like.

Meanwhile, as illustrated in FIG. 3, the driving shaft 100 and the middle housing 200 may move in the axial direction with respect to the outer housing 300. While moving in the axial direction, the driving shaft 100 may rotate at the same speed, and even when moving in the axial direction, it may be necessary to supply a working fluid to each of the fluid supply paths 112, 113, 114, and 115. As illustrated, the working fluid supplied through the second through hole 304 may be transferred to the fluid supply path 112 through the first through hole 254 of the middle housing 200, even if the driving shaft 100 moves downward. The reason is that the second sealing member 206 may block the transfer of the fluid to another path. In the same way, the fluid supplied through the second through hole 308 may be transferred to the fluid supply path 114 through the first through hole 258 of the middle housing 200, even if the driving shaft 100 moves downward. Owing to the installation position of the second sealing member 206, the fluid supplied through the second through hole 308 may be connected with only one first through hole 258 and may not be connected with the other first through holes 254, 256, and 260.

According to the linear movable rotary union according to the above-described embodiment, while rotating the driving shaft, the driving shaft may be transported in the vertical direction with respect to the outer housing together with the middle housing, such that the rotary union may adjust the distance in the vertical direction with respect to a work object without a separate apparatus.

In addition, the sealing member may be provided between the driving shaft, the middle housing and the outer housing, thereby effectively preventing leakage of fluid even during rotational motion and reciprocating motion in the axial direction.

In addition, it is possible to prevent leakage of the fluid by improving the sealing force, while simplifying the sealing structure to facilitate manufacturing, maintenance and repair, and minimizing the size to reduce the installation space.

In the above-described embodiment, it is described by way of example that the driving shaft performs rotational motion in the middle housing and the middle housing performs reciprocating motion in the axial direction in the outer housing. However, the driving shaft may be installed to be capable of linear motion in the axial direction in the middle housing, and the middle housing may be installed to be capable of rotational motion in the outer housing, and in this case, the same effect may be obtained.

Hereinafter, a sealing member used in a linear movable rotary union according to an embodiment of the present disclosure will be described.

Figure 7:
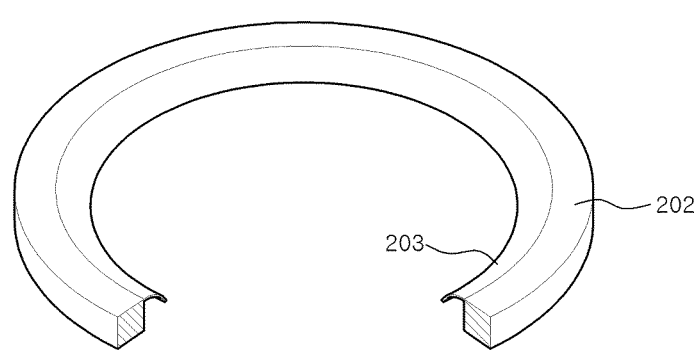
FIG. 7 is a perspective view of a sealing member used in a linear movable rotary union according to an embodiment of the present disclosure.

FIG. 7 is a perspective view of a sealing member used in a linear movable rotary union according to an embodiment of the present disclosure.

Referring to FIG. 7, the first sealing member 202 may be a lip seal having a curved lip 203 formed on the inner periphery of an annular sealing. Although the second sealing member 206 is described as an O-ring by way of example in the embodiment shown in FIG. 2, the second sealing member 206 may also be a lip seal shown in FIG. 7. A through hole is formed in the center of the first sealing member 202 such that the driving shaft 100 may penetrate. The first sealing member 202 may be formed of synthetic resin having flexibility such as rubber or plastic. Meanwhile, as shown in FIG. 3, a ring-shaped pressurization fixing member 204 that pressurizes the first sealing member 202 may be provided on the side surface of the first sealing member 202 such that each first sealing member 202 is closely fixed to the inner periphery of the middle housing 200. The pressurization fixing member 204 is preferably formed of metal such that the flexible first sealing member 202 is disposed on the inner periphery of the middle housing 200 to maintain its state.

Meanwhile, in the above-described embodiment, it is described by way of example that the lips 203 of the plurality of first sealing members 202 are all directed in the same direction, but the sealing surfaces of the two first sealing members 202 are opposed to each other and faced up and down on a position where the sealing members are installed to form a pair such that the directions of the lips 203 may be opposed to each other up and down. In this case, the leading end of the first sealing member is grounded to the outer periphery of the driving shaft 100 and thus, the sealing force due to a line contact may be provided. According to the sealing member according to the present embodiment, the sealing member may be in line contact with a rotating object to minimize the frictional force, which requires no separate supply of a lubricant, and thus the structure may be very brief and simple.

Although the present disclosure has been described with reference to the embodiment shown in the drawings, this is merely exemplary and will be understood by those of ordinary skill in the art that various modifications and equivalent other embodiments are possible. Therefore, the true technical protection scope of the present disclosure will be defined by the technical spirit of the appended claims.

What is claimed is:
1. A linear movable rotary union comprising:
a driving shaft comprising a plurality of fluid supply paths;
a hollow middle housing surrounding an outside of the driving shaft and comprising a plurality of first through holes in a sidewall;
a plurality of first sealing members provided between the middle housing and the driving shaft to prevent leakage of a fluid;
a hollow outer housing surrounding an outside of the middle housing and comprising a plurality of second through holes in a sidewall; and a plurality of second sealing members provided between the middle housing and the outer housing to prevent leakage of the fluid, wherein the driving shaft is provided to be capable of rotational motion in the middle housing, and the middle housing is provided to be capable of reciprocating motion in an axial direction in the outer housing, and wherein a bearing is provided between the driving shaft and the middle housing, and the first sealing member is a seal for rotational motion.

2. The linear movable rotary union of claim 1, wherein the middle housing is formed in a multistep with an outer diameter decreasing toward one end portion, and the outer housing is formed in a multistep with an inner diameter decreasing toward one end portion, and wherein a locking protrusion is formed on each of a part of the middle housing where the outer diameter decreases and a part of the outer housing where the inner diameter decreases to restrict reciprocating motion in the axial direction of the middle housing.

3. The linear movable rotary union of claim 1, wherein a projection extending along the axial direction is formed on any one of an outer circumferential surface of the middle housing and an inner circumferential surface of the outer housing, and a groove into which the projection is inserted is formed in the other one.

4. The linear movable rotary union of claim 1, wherein the second sealing member is a linear seal for reciprocating motion.

5. The linear movable rotary union of claim 1, wherein the first sealing member and the second sealing member are formed of synthetic resin.

6. The linear movable rotary union of claim 1, wherein an outer circumferential surface of the driving shaft, an inner circumferential surface and an outer circumferential surface of the middle housing, and an inner circumferential surface of the outer housing are polished.

7. The linear movable rotary union of claim 1, further comprising:

a driving unit connected to one end portion of the driving shaft to allow the driving shaft to perform rotational motion with respect to the middle housing and connected to one end portion of the middle housing to allow the middle housing to perform reciprocating motion in the axial direction with respect to the outer housing.

8. The linear movable rotary union of claim 7, wherein the driving unit comprises a linear guide connected to the middle housing.

9. The linear movable rotary union of claim 1, wherein the plurality of first sealing members are provided on an inner circumferential surface of the middle housing and are spaced apart from each other to respectively correspond to positions of the plurality of fluid supply paths of the driving shaft.

10. The linear movable rotary union of claim 1, wherein the plurality of second sealing members are provided on an outer circumferential surface of the middle housing, are connected to only the second through holes of the outer housing respectively corresponding to the first through holes of the middle housing and are spaced apart from each other in positions of the other second through holes where sealing is maintained.

11. The linear movable rotary union of claim 1, wherein a fluid introduced from the fluid supply path is discharged to the second through hole when the fluid supply path of the driving shaft, the first through hole of the middle housing, and the second through hole of the outer housing are connected with each other.

12. The linear movable rotary union of claim 1, wherein a fluid introduced from the second through hole is discharged to the fluid supply path when the fluid supply path of the driving shaft, the first through hole of the middle housing, and the second through hole of the outer housing are connected with each other.

13. The linear movable rotary union of claim 1, wherein a negative pressure chamber is connected to any one of the plurality of second through holes, and negative pressure is formed in any one of the plurality of fluid supply paths connected to the negative pressure chamber.

14. A linear movable rotary union comprising, a driving shaft comprising a plurality of fluid supply paths;

a hollow middle housing surrounding an outside of the driving shaft and comprising a plurality of first through holes in a sidewall;

a plurality of first sealing members provided between the middle housing and the driving shaft to prevent leakage of a fluid;

a hollow outer housing surrounding an outside of the middle housing and comprising a plurality of second through holes in a sidewall; and a plurality of second sealing members provided between the middle housing and the outer housing to prevent leakage of the fluid, wherein the driving shaft is provided to be capable of rotational motion in the middle housing, and the middle housing is provided to be capable of reciprocating motion in an axial direction in the outer housing, and wherein the first sealing member is a lip seal with a curved lip formed on an inner periphery of an annular sealing.

15. A linear movable rotary union comprising:

a driving shaft comprising a plurality of fluid supply paths;

a hollow middle housing surrounding an outside of the driving shaft and comprising a plurality of first through holes in a sidewall;

a plurality of first sealing members provided between the middle housing and the driving shaft to prevent leakage of a fluid;

a hollow outer housing surrounding an outside of the middle housing and comprising a plurality of second through holes in a sidewall; and a plurality of second sealing members provided between the middle housing and the outer housing to prevent leakage of the fluid, and wherein the driving shaft is provided to be capable of vertical motion in an axial direction in the middle housing, and the middle housing is provided to be capable of rotational motion in the outer housing.

* * * * *